(12) United States Patent
Besold et al.

(10) Patent No.: US 7,706,141 B2
(45) Date of Patent: Apr. 27, 2010

(54) DEVICE WITH INTEGRATED ELECTRONIC COMPONENTS PROVIDED WITH A PARTITION FOR SEPARATING VENTILATED ZONES

(75) Inventors: Jean-Eric Besold, Paris (FR); Etienne Merlet, Paris (FR)

(73) Assignee: Sagem Defense Sécurité, Paris (FR)

( * ) Notice: Subject to any disclaimer, the term of this patent is extended or adjusted under 35 U.S.C. 154(b) by 140 days.

(21) Appl. No.: 11/955,991

(22) Filed: Dec. 13, 2007

(65) Prior Publication Data
US 2008/0151494 A1 Jun. 26, 2008

(30) Foreign Application Priority Data
Dec. 18, 2006 (FR) .................................. 06 11024

(51) Int. Cl.
*H05K 7/20* (2006.01)
(52) U.S. Cl. ...................... 361/690; 361/692; 361/694; 361/695
(58) Field of Classification Search ................ 361/690, 361/692, 694, 695, 679.46, 679.48–679.51
See application file for complete search history.

(56) References Cited
U.S. PATENT DOCUMENTS

| | | | | |
|---|---|---|---|---|
| 4,399,485 A | * | 8/1983 | Wright et al. ................ | 361/693 |
| 4,860,163 A | * | 8/1989 | Sarath ......................... | 361/695 |
| 4,894,749 A | * | 1/1990 | Elko et al. .................... | 361/690 |
| 5,077,601 A | * | 12/1991 | Hatada et al. ................ | 257/722 |
| 5,103,374 A | * | 4/1992 | Azar ............................ | 361/689 |
| 5,210,680 A | * | 5/1993 | Scheibler ..................... | 361/695 |
| 5,396,401 A | | 3/1995 | Nemoz | |
| 5,563,768 A | * | 10/1996 | Perdue ......................... | 361/695 |
| 5,914,858 A | * | 6/1999 | McKeen et al. .............. | 361/695 |
| 6,222,729 B1 | * | 4/2001 | Yoshikawa ................... | 361/695 |

(Continued)

FOREIGN PATENT DOCUMENTS
EP 0 578 520 A1 6/1993

(Continued)

OTHER PUBLICATIONS

Preliminary Search Report for FR 0611024, dated Sep. 25, 2007.

*Primary Examiner*—Anatoly Vortman
(74) *Attorney, Agent, or Firm*—Marshall, Gerstein & Borun LLP (57) ABSTRACT

Device with integrated electronic components, that comprises a board forming a support for the said components, a cover mounted on the said board to cover the said components, and a separating partition which extends from the cover to the board substantially perpendicularly to the latter, the said partition separating two distinct zones of the board, wherein it comprises an overcover covering the cover and defining an internal space between the cover and the overcover in which are provided cooling gas division means delimiting two distinct secondary spaces in the internal space, an upstream secondary space into which cooling gas is able to be injected and a downstream secondary space into which cooling gas is able to be discharged so that cooling gas injected into the upstream zone of the board is directed toward the downstream secondary space of the internal space and that cooling gas injected into the upstream secondary space of the internal space is directed toward the downstream zone of the board.

10 Claims, 4 Drawing Sheets

U.S. PATENT DOCUMENTS

| | | | |
|---|---|---|---|
| 6,400,567 B1 * | 6/2002 | McKeen et al. | 361/695 |
| 6,515,856 B2 * | 2/2003 | Hidesawa | 361/679.48 |
| 6,912,131 B2 * | 6/2005 | Kabat | 361/720 |
| 6,927,975 B2 * | 8/2005 | Crippen et al. | 361/679.49 |
| 6,961,242 B2 * | 11/2005 | Espinoza-Ibarra et al. | 361/695 |
| 7,012,807 B2 * | 3/2006 | Chu et al. | 361/699 |
| 7,154,748 B2 * | 12/2006 | Yamada | 361/690 |
| 7,218,516 B2 * | 5/2007 | Yu et al. | 361/695 |
| 7,361,081 B2 * | 4/2008 | Beitelmal et al. | 454/184 |
| 7,529,087 B2 * | 5/2009 | Dubrule et al. | 361/692 |
| 7,558,056 B2 * | 7/2009 | Suzuki et al. | 361/679.49 |
| 2002/0159232 A1 * | 10/2002 | Beitelmal et al. | 361/695 |
| 2003/0172669 A1 * | 9/2003 | Tilton et al. | 62/310 |
| 2004/0112582 A1 * | 6/2004 | Beitelmal et al. | 165/247 |
| 2004/0163797 A1 * | 8/2004 | Cosley et al. | 165/80.4 |

FOREIGN PATENT DOCUMENTS

| | | |
|---|---|---|
| FR | 2864423 | 6/2005 |
| JP | 62-117399 | 5/1987 |
| JP | 02130894 A * | 5/1990 |
| WO | WO-2007/047388 | 4/2007 |

* cited by examiner

PRIOR ART

DEVICE WITH INTEGRATED ELECTRONIC COMPONENTS PROVIDED WITH A PARTITION FOR SEPARATING VENTILATED ZONES

TECHNICAL FIELD

The invention relates to devices with integrated electronic components. It relates more particularly to a device with integrated electronic components comprising a board forming a support for said components, and a cover mounted on this board to cover the components.

BACKGROUND ART

Such devices are found in many fields, and more particularly in aviation, a field in which the problems associated with this type of device have been posed to the inventors.

Specifically, these devices are routinely used for controlling various functional portions of aircraft or helicopters, and particularly the automatic pilot control.

In this particular field, it is essential to ensure a permanent operating security of the electronic components of the device, in order to ensure the security and precision of the automatic pilot.

Some electronic devices designed for the automatic pilot control comprise, implemented on the supporting board, two distinct control electronic circuits capable of taking over from one another in the event of a failure.

Because of the extreme heat conditions to which the components are subjected, it is necessary to provide uninterrupted ventilation of the device. Usually, this ventilation is provided by a current of cooling air that flows parallel to the surface of the supporting board.

A disadvantage of this arrangement is that, when a component of one of the circuits explodes, the current of cooling air risks carrying the debris of the component in question and spreading it over the parallel circuit. Because of the sensitivity of certain components of the latter, the debris risks damaging the parallel circuit, not to mention that, if this debris is conductive, it may create short circuits in the parallel circuit.

In order to solve this problem, document FR 2 864 423 has proposed a device with integrated electronic components provided with a meshed separating partition. More precisely, document FR 2 864 423 proposes a device with integrated electronic components, that comprises a board forming a support for the components, and a cover mounted on the board to cover the components, and a meshed partition which extends from the cover to the board substantially perpendicularly to the latter, the partition separating two distinct zones of the board in which electronic components are placed.

Figure 1:
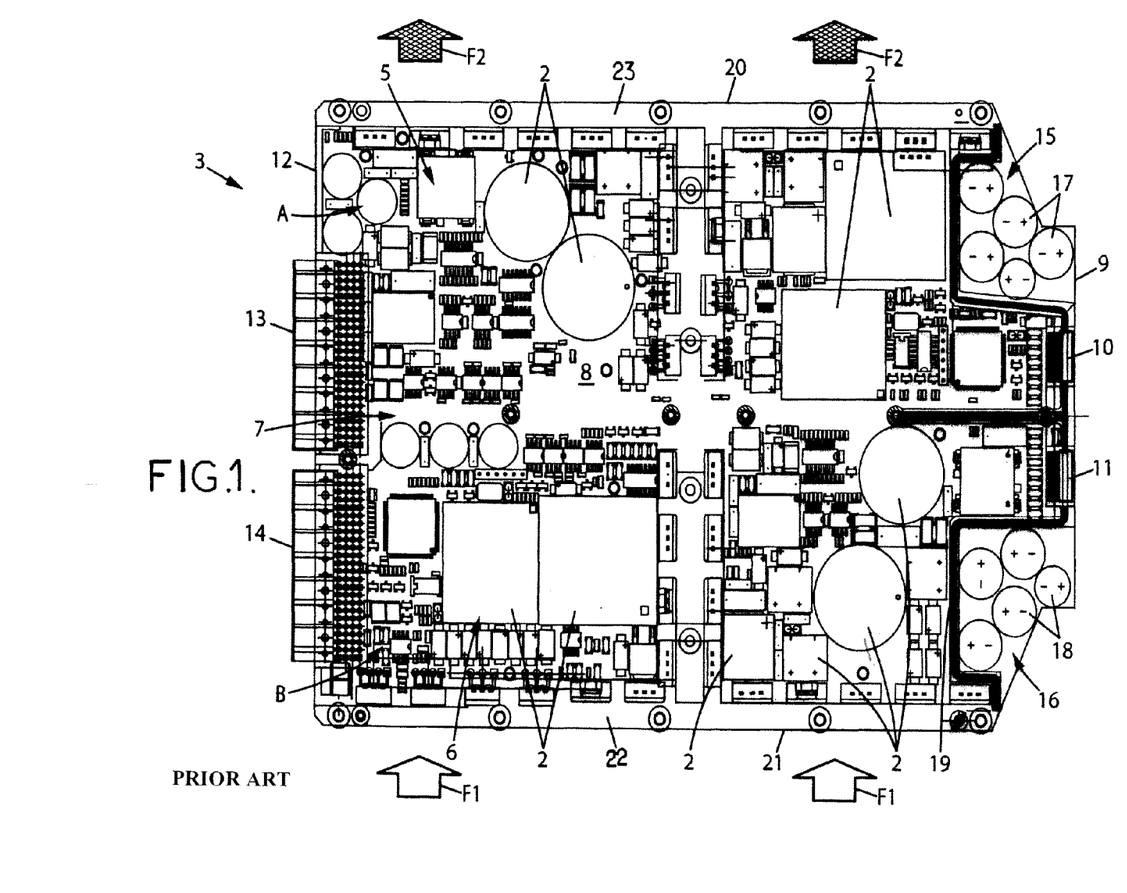
FIG. 1 is a plan view of an electronic circuit board on which electronic components of two parallel control circuits are implemented.
Figure 2:
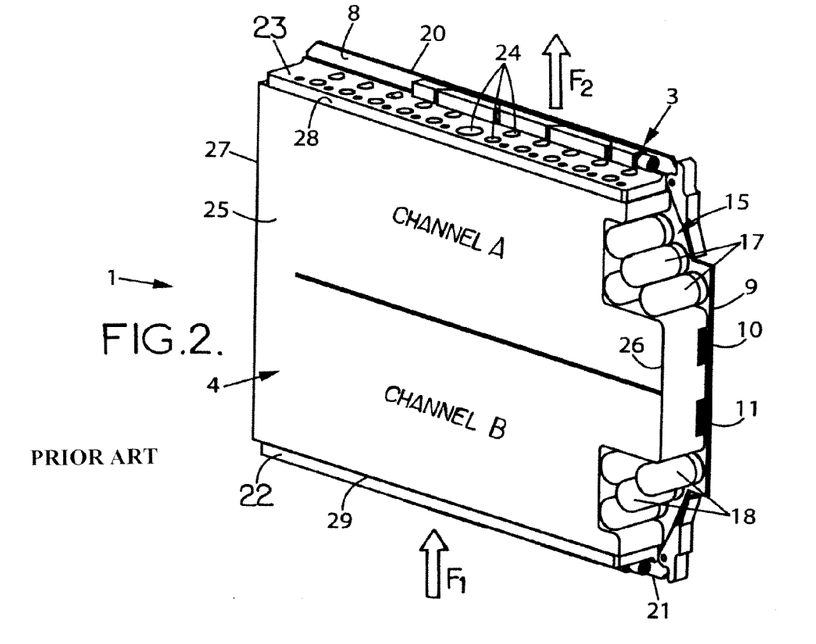
FIG. 2 is a schematic view in perspective of a device according to the prior art illustrating the board of FIG. 1, which comprises a board on which a cover jointly covering the two control circuits is mounted, the cover bearing two inscriptions, CHANNEL A and CHANNEL B, each corresponding to one of the circuits in order to allow them to be identified by a maintenance technician.

More precisely, FIG. 1 represents a plan view of a board forming a support for the electronic circuits, and notably described in document FR 2 864 423, and FIG. 2 is a schematic view in perspective of the zone protection device described in this same document FR 2 864 423.

FIG. 2 also illustrates a device 1 with integrated electronic components 2, that comprises a board 3, represented in plan view in FIG. 1, forming a support on which the components 2 are implemented, and a cover 4 designed to be mounted on the board 3 to cover the components 2 and thereby protect them from the consequences of a possible destruction of some of them.

As can be seen in FIG. 1, the components 2 are grouped into two distinct adjacent zones 5, 6 which form two distinct control electronic circuits. These are in practice control circuits for an automatic pilot system of an aircraft or of a helicopter. In the rest of the description, these circuits are respectively called CHANNEL A and CHANNEL B.

As appears in FIG. 1, the channels A and B are slightly separated from one another, an interstice 7 being arranged between them on the board 3. The details of producing the circuits 5, 6 will not be described. Note however that the board 3 comprises a substantially rectangular plate 8 made of an insulating material that forms the support on which the components 2 are implemented.

Note also that the board 3 has a front edge 9 onto which are mounted a primary connector 10 for plugging in a test cable and debugging channel A and a secondary connector 11 adjacent to the primary connector 10 for plugging in a test cable and debugging channel B. The board 3 also has a rear edge 12, at the other end from the front edge 9, on which are mounted, on the side of channel A, a backplane primary connector 13 for plugging in a power supply bus and connecting channel A to the controlled system (in this instance, the automatic pilot) and, on the side of channel B, a secondary backplane connector 14 for plugging in a power supply bus and for connecting channel B to the controlled system.

As can be seen in FIG. 1, the board 3 has, on the side of its front edge 9, two auxiliary zones 15, 16 in which filtering capacitors 17, 18 are implemented associated with channels A and B respectively.

The board 3 may also comprise a partition 19 that separates the auxiliary zones 15, 16 of the respective channels A and B in order to isolate the capacitors 17, 18 from the other components 2 of the corresponding channel. According to a preferred embodiment, this partition consists of a front edge of the cover 4.

In addition, as can be seen in FIG. 2, the board 3 has, along two lateral edges 20, 21 joining the front edge 9 and rear edge 12, two walls 22, 23, namely an upstream wall 22 bordering channel B and a downstream wall 23 bordering, at the other end, channel A, walls in which openings 24 are made to allow a current of cooling air to pass through which, sweeping through the upstream wall 22 (arrows F1), is discharged through the downstream wall 23 (arrows F2) after having sustained a heat transfer with the components 2 of channels A and B. In this instance, the lateral partitions 22 and 23 are formed by radiators fixed to the board 3, which allow high calorific dissipation electronic components to be mounted on the latter. If such radiators are unnecessary, the lateral partitions 22, 23 could be formed by lateral edges of the cover 4.

The cover 4 for its part comprises a substantially flat bottom wall 25 of substantially rectangular shape, designed to jointly cover channels A and B and having a front edge 26 and a rear edge 27 designed to be placed in line with the front edge 9 and rear edge 12 of the board 3 respectively, connected by two parallel side edges 28, 29 designed to be placed between and against the upstream wall 22 and the downstream wall 23 of the board 3.

However, the Applicant has been able to ascertain that the device described in document FR 2 864 423 does not allow sufficient and equivalent ventilation and cooling of channels A and B of the board 3.

Specifically, before cooling channel A, the ventilation current has already passed through channel B. The air reaching the level of channel A has therefore already been heated and cannot cool channel A in an equivalent manner.

The object of the invention is in particular to solve this problem by producing a device allowing cooling that is identical between channel A and channel B of the board 3.

It is a known practice according to the prior art to provide in this case a double ventilation circuit, namely a ventilation circuit for channel A and a ventilation circuit for channel B.

To do this, in order to allow the formation of two identical ventilations for the two channels A and B, it is necessary to provide a thermal channel passing through channel A and a thermal channel passing through channel B. This solution requires a vertical placement of channels A and B: for example, channel A in a front zone, and channel B in a rear zone. But then, if the idea of boards that can be plugged into a backplane is maintained, to retain the access of channel A to the backplane rear connectors, and where necessary the access of channel B to the front face test connectors, it becomes necessary to define, through each of the channels, a transit zone for the power supplies and signals of the opposite channel.

In addition, this solution is unsatisfactory in terms of cost and space requirement.

The object of the invention is therefore to solve the aforementioned disadvantages by proposing a device of the aforementioned type, which allows an identical or equivalent ventilation of two channels of a plug-in board by forming a thermal segregation of the two channels while preventing any thermal coupling between the two channels.

The aim of one of the subjects of the invention is also to avoid the failure of one circuit board leading to the failure of the other, and to guarantee an increased operating security of the electronic components.

The aim of one of the subjects of the invention is also to form a fire-preventive segregation, namely to form an electromagnetic interference shield between two identical channels of a plug-in board.

SUMMARY OF THE INVENTION

According to a first of its aspects, the present invention relates to a device with integrated electronic components, that comprises a board forming a support for the components, a cover mounted on the board to cover the components, and a separating partition which extends from the cover to the board substantially perpendicularly to the latter, the partition separating two distinct zones of the board in which electronic components are placed, cooling gas being able to be injected into one of the two distinct zones of the board called the "upstream zone", and able to be discharged into the other of the two distinct zones of the board, called the "downstream zone", wherein the device comprises an overcover covering the cover and defining an internal space between the cover and the overcover in which are provided cooling gas division means delimiting two distinct secondary spaces in the internal space, an upstream secondary space into which cooling gas is able to be injected and a downstream secondary space into which cooling gas is able to be discharged so that cooling gas injected into the upstream zone of the board is directed toward the downstream secondary space of the internal space and that cooling gas injected into the upstream secondary space of the internal space is directed toward the downstream zone of the board.

So as to allow the interchange of cooling gas between the internal space and the upstream/downstream zones of the board, the cooling gas division means comprise at least one pair of deflectors associated with at least one pair of orifices provided in the cover on either side of the separating partition, at least one deflector opening into the downstream secondary space and at least one deflector opening into the upstream secondary space.

In order to cool in an identical manner two identical circuits provided on either side of the separating partition of the board, the deflectors are distributed in a symmetrical manner relative to the separating partition.

In order to form a laminar flow and without loss of pressure or vortex and dead zone when the cooling gas passes from a secondary space to a zone of the board, and vice versa, the deflector comprises a beveled zone of increasing thickness with an edge that is substantially indistinguishable from the overcover and another edge substantially indistinguishable from the cover.

Again to form a cooling gas flow without loss of pressure or vortex and dead zone, the edge substantially indistinguishable from the cover of the beveled zone of the deflector forms a leading edge for a deflector situated in the upstream secondary space and a trailing edge for a deflector situated in the downstream secondary space.

Similarly, the edge substantially indistinguishable from the overcover of the beveled zone of the deflector forms a trailing edge for a deflector situated in the upstream secondary space and a leading edge for a deflector situated in the downstream secondary space.

According to an advantageous embodiment of a deflector allowing the cooling gas to flow without loss of pressure, each deflector comprises a substantially quadrangular central zone, and a triangular zone forming a pointed end, the height of each of the central zone and the triangular zone being equal to the distance between the cover and the overcover.

In order to form a fire-preventive segregation between the two electronic circuits of the board, each deflector is made of a nonflammable material, for example of the polymer type.

In order to form an electromagnetic shield between the two electronic circuits of the board, each deflector is made of an electrically conductive material, for example of the metal type or for example of the filled or coated polymer type.

According to a second of its aspects, the present invention relates to a method for cooling two distinct zones of a device with integrated electronic components that comprises a board forming a support for the said components, a cover mounted on the board to cover the components, and a separating partition which extends from the cover to the board substantially perpendicularly to the latter, the partition separating the two distinct zones of the board in which the electronic components are placed, cooling gas being able to be injected into one of the two distinct zones of the board called the "upstream zone", and able to be discharged into the other of the two distinct zones of the board, called the "downstream zone" (A), wherein the method comprises a step of passing cooling gas via gas division means provided in an internal space between the cover and an overcover delimiting two distinct secondary spaces in the internal space, an upstream secondary space into which cooling gas is injected and a downstream secondary space into which cooling gas is discharged so that cooling gas injected into the upstream zone of the board is directed toward the downstream secondary space of the internal space and that cooling gas injected into the upstream secondary space of the internal space is directed toward the downstream zone of the board.

BRIEF DESCRIPTION OF THE DRAWINGS

The present invention is now described with the aid of an example that is solely illustrative and in no way limiting of the scope of the invention. Other objects and advantages of the invention will appear in the light of the description made below with reference to the appended drawings in which.

DESCRIPTION OF THE PREFERRED EMBODIMENT OF THE INVENTION

Figure 3:
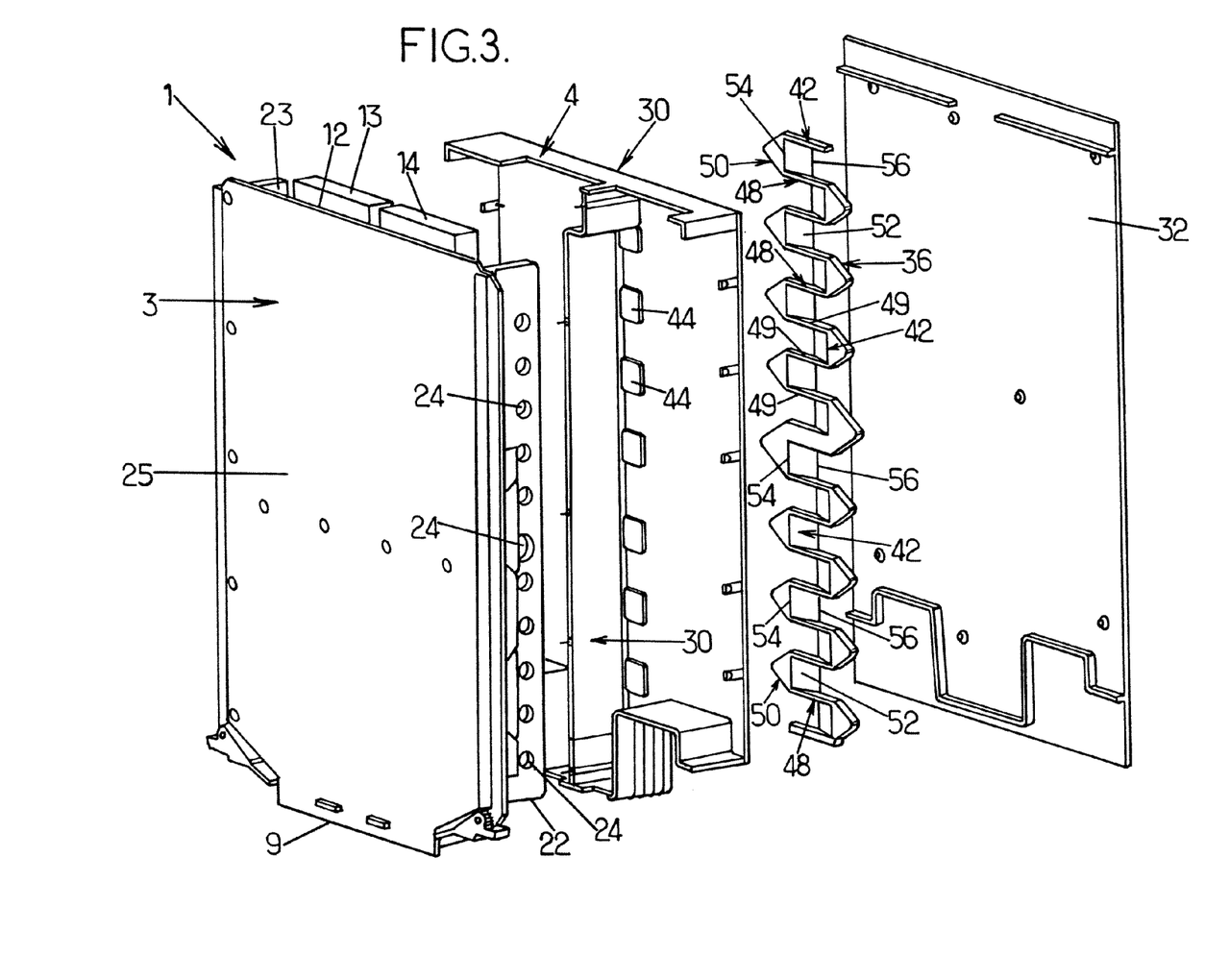
FIG. 3 is an exploded view in perspective of the device with integrated components according to the invention.

FIG. 3 shows, in an exploded view in perspective, a board 3, as described in FIG. 1, covered by a cover 4 with at least one solid wall partition 30, that is to say with no opening and no mesh, capable of physically separating channels A and B and of preventing air from passing from one of the two channels A, B to the other of the two channels A, B.

The present invention therefore relates to a device 1 with integrated electronic components 2, that comprises a board 3 forming a support for the components 2, a cover 4 mounted on the board 3 to cover the components 2, and a partition 30 which extends from the cover 4 to the board 3 substantially perpendicularly to the latter, the said partition 30 separating two distinct zones A, B of the board 3 in which electronic components 2 are placed, air being able to be injected into one of the two distinct zones A, B of the board called the "upstream zone B", and able to be discharged into the other of the two distinct zones A, B of the board, called the "downstream zone A".

The device 1 also comprises an overcover 32 covering the cover 4 and defining an internal space 34 between the cover 4 and the overcover 32 in which are provided means 36 of division distribution/orientation of cooling gas (preferably air) delimiting two distinct secondary spaces 38, 40 in the internal space 34, an upstream secondary space 38 into which the air is able to be injected and a downstream secondary space 40 into which the air is able to be discharged so that the air injected into the upstream zone B of the board 3 is directed toward the downstream secondary space 40 of the internal space 34 and that the air injected into the upstream secondary space 38 of the internal space 34 is directed toward the downstream zone A of the board 3.

Although the description of the invention is made for cooling of the electronic circuits with the aid of air, it is well understood that the principle of the invention remains identical for any cooling gas.

The air division means 36 may be provided either independently of the cover 4, and are attached thereto by any attachment means, for example by screwing and/or bonding, or be provided directly incorporated into the cover 4, the air division means 36 and the cover 4 then forming a monobloc assembly.

The air division means 36 may also be provided either independently of the cover 4 and overcover 32, and are attached thereto by any attachment means, for example by screwing and/or bonding of all three parts, or be provided directly incorporated into the cover 4 and the overcover 32, the air division means 36, the cover 4 and the overcover 32 then forming a monobloc assembly made simultaneously, for example by stereolithography.

The air division means 36 comprise at least one pair of deflectors 42 associated with at least one pair of orifices 44, 46 provided in the cover 4, and more precisely in the bottom wall 25 of the cover 4, on either side of the separating partition 30. Therefore, at least one deflector 42 opens into the upstream secondary space 38 and at least one deflector 42 opens into the downstream secondary space 40.

This therefore forms a first set of orifices 44 upstream, that is to say a set of orifices situated in the upstream zone B of the board 3, and a second set of orifices 46 downstream, that is to say a set of orifices situated in the downstream zone A of the board 3. Therefore, associated with each orifice 44, 46 formed either in the bottom wall 25 covering the upstream zone B of the board 3, or in the bottom wall 25 covering the downstream zone A of the board 3, is a deflector 42 able to divert air injected into one of the zones A, B of the board 3 toward a secondary space 38, 40 of the internal space 34, and able to divert air injected into one of the secondary spaces 38, 40 of the internal space 34 toward one of the zones A, B of the board 3.

Figure 5:
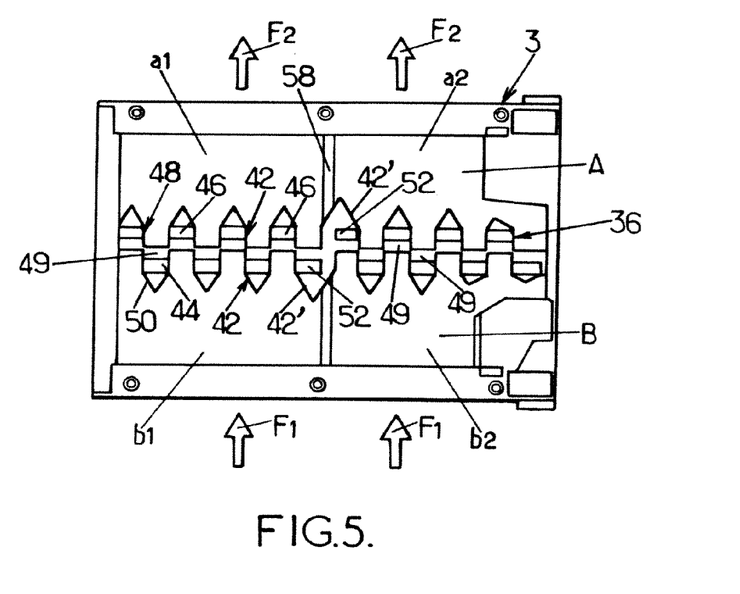
FIG. 5 is a top view of the air division means attached to the cover; the cover and the overcover not being shown for purposes of clarity.

Each deflector 42 comprises a substantially quadrangular central zone 48, for example in the shape of a square or a rectangle, and a triangular zone 50 forming a pointed end, and attached to one of the edges of the central zone 48, the height or thickness of each of the central zone 48 and triangular zone 50 being equal to the distance between the cover 4 and the overcover 32.

The central zone 48 has a beveled zone 52 of increasing thickness so that one edge 54 of the beveled zone 52 is substantially indistinguishable from the cover 4 and that another edge 56 of the beveled zone 52 is substantially indistinguishable from the overcover 32, once the latter is attached to the cover 4. The beveled zone 52 forms a planar surface allowing a laminar air flow.

In other words, once the air division means 36 are attached to the cover 4 or when they are directly formed with the cover 4 and/or the overcover 32, each beveled zone 52 has a proximal edge 56, situated close to the separating partition 30, that is the edge substantially indistinguishable from the overcover 32, and a distal edge 54, at a distance from the separating partition 30, that is substantially indistinguishable from the cover 4.

The central zone 48 has two branches 49 that are parallel with one another and between them the beveled zone 52 is formed, the proximal edge 56 and distal edge 54 of the beveled zone 52 then being made perpendicular to the branches 49.

The orifices 44, 46 provided in the cover 4 are formed in an alternating manner on either side of the separating partition 30, and along the bearing zone of the partition 30 on the bottom wall 25 of the cover 4.

The orifices 44, 46 are advantageously provided in quadrangular shape with a proximal edge of the orifice 44, 46 flush with the proximal edge 56 of the beveled zone 52 of the deflector 42 and another distal edge of the orifice 44, 46 substantially indistinguishable from the distal edge 54 of the beveled zone 52 of the deflector 42.

Figure 4:
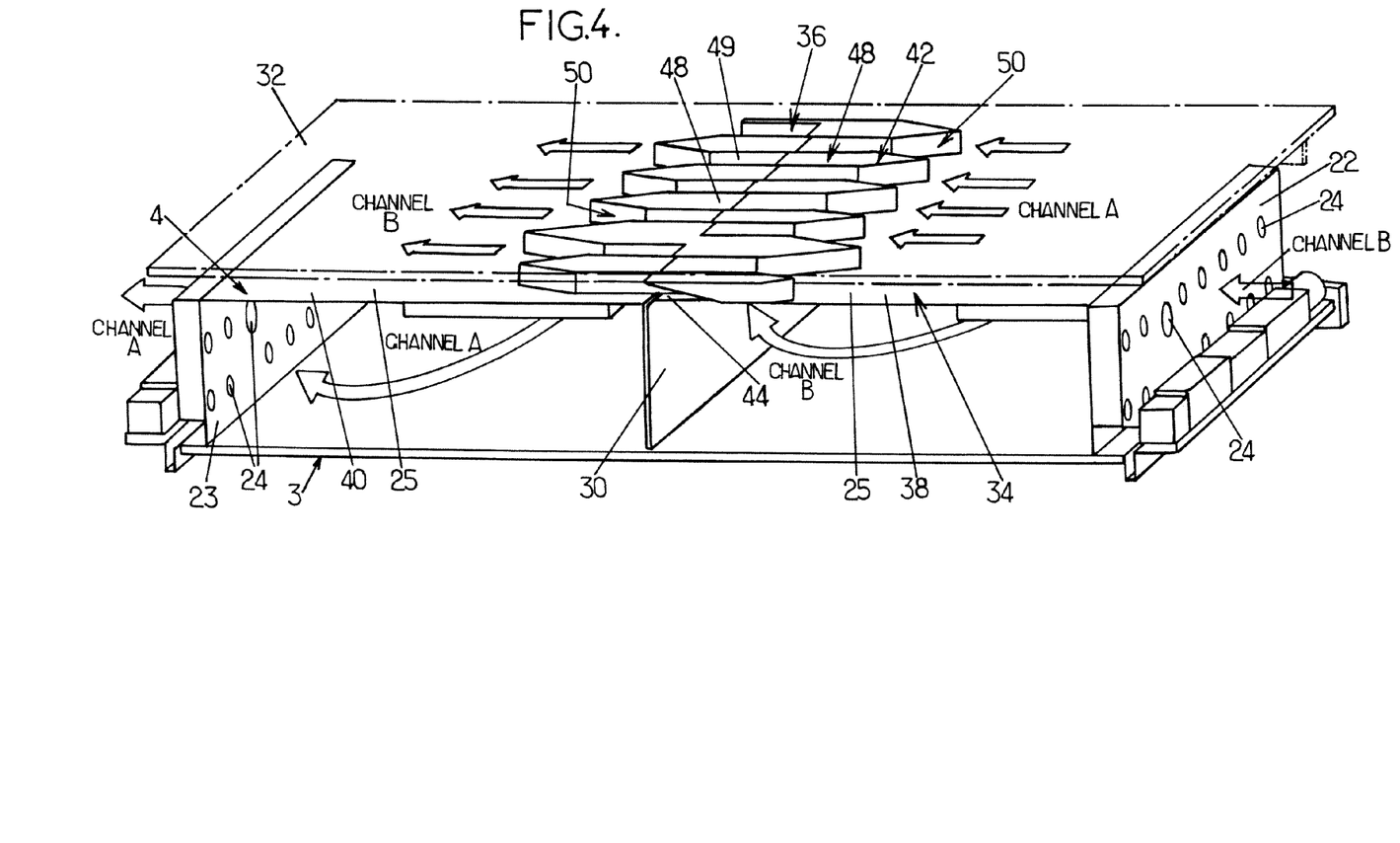
FIG. 4 is a side view in perspective of the device according to the invention, the overcover being shown transparently.

When cooling air is injected simultaneously into the upstream zone B and into the upstream secondary space 38, the edge 56 substantially indistinguishable from the cover 4, or the distal edge 54 of the beveled zone 52 of the deflector 42 forms a leading edge for a deflector 42 situated in the upstream secondary space 38 and a trailing edge for a deflector 42 situated in the downstream secondary space 40. In a similar and symmetrical manner, the edge 54 substantially indistinguishable from the overcover 32 of the beveled zone 52 of the deflector 42 forms a trailing edge for a deflector 42 situated in the upstream secondary space 38 and a leading edge for a deflector 42 situated in the downstream secondary space 40.

The deflectors 42 provided in the internal space 34 are formed so that at least one deflector 42 situated in the upstream secondary space 38 is in lateral contact with at least one deflector 42 situated in the downstream secondary space 40. Therefore, the air division means 36 consist preferably of a plurality of deflectors 42 with an alternation of deflectors on either side of the partition 30, each deflector 42 then having at least one branch 49 in common with an immediately adjacent deflector 42.

In a supplementary manner, and as is more particularly visible in FIG. 5, each central zone 48 comprises a secondary zone 49 making it possible to offset the beveled zone either toward the upstream wall 22, or toward the downstream wall 23, of a height equal to the distance between the cover 4 and the overcover 32, the beveled zone 52 being provided between the pointed zone 50 and this zone 49. The parameters of the width of the secondary zone 49 are set so that the thickness of the partition 30 is substantially equal to or less than the sum of the width of the secondary zone 49 of an upstream deflector 42 and the width of the secondary zone 49 of a downstream deflector 42. Therefore, a discharge or an entrance of cooling air is obtained in the deflectors 42 on each face of the separating partition 30.

As an example, the layer of air flowing in the internal space 32 is a few millimeters thick.

In addition, again to reduce as much as possible the loss of pressure of the air flow circulating in the upstream secondary space 38 and the upstream zone B, provision is made for the cumulative passageway section corresponding to all the distal edges of each orifice 44, 46 formed in the bottom wall of the cover 4 to be greater than the passageway section between the cover 4 and the overcover 32.

Therefore, according to the invention, a constant flow of air is obtained between the air passing into the upstream secondary space 38 and into the upstream zone B, those skilled in the art being able to set the parameters of the dimensions of the openings 24 in the upstream wall 22 so that the same quantity of air flows into the upstream zone B and into the upstream secondary space 38.

Similarly, in order to prevent any loss of pressure, air vortex, or dead zone with no ventilation, when the cooling air passes from the upstream secondary space 38 to the downstream zone A and from the upstream zone B to the downstream secondary space 40, provision is made to form no right angle and to provide only smooth surfaces allowing a current to form with no turbulence, or air vortex, or dead zone with no ventilation that is likely to create a loss of pressure or improperly cooled zones on the board, when the cooling air travels across the board 3.

The pointed ends 50 of the deflectors 42 are formed in a symmetrical manner relative to the central zone 48 so as to divide into two without turbulence the air flow arriving at this point 50.

According to a preferred embodiment, symmetry is provided between the deflectors 42 situated in the upstream secondary space 38 and the deflectors 42 situated in the downstream secondary space 40 (and consequently symmetry of the orifices 44, 46 provided on either side of the separating partition 30).

However, it is also possible to provide a supply of cooling air that is different between the two distinct zones A, B of the board 3, for example by providing more deflectors in one of the two secondary spaces 38, 40 of the internal space 34 between the cover 4 and the overcover 32 and/or by injecting more air into the upstream zone B relative to the upstream secondary space 38 and vice versa or for example by providing larger or smaller orifices 44.

According to the invention, this provides a division of air between two distinct zones A, B of the board 3, the air not having been previously heated by its journey across one of the two zones A, B before cooling the other of the two zones A, B of the board 3.

According to a first embodiment of the air division means 36, the deflectors 42, and the cover 4, and where necessary the overcover 32, are made of a nonflammable or self-extinguishing material, for example of the polymer type that can either be molded or injected or made by stereolithography. Therefore, in addition to thermal segregation between the two district zones A, B of the board 3, a fire-preventive segregation is also obtained between the two distinct zones A, B.

According to a second embodiment of the air division means 36, the deflectors 42, and the cover 4, and where necessary the overcover 32, are made of an electrically conductive material, for example of the metal type (such as aluminum), or of filled and/or coated polymer type. Therefore, in addition to a thermal segregation between the two distinct zones A, B of the board 3, an electromagnetic interference or EMI shield is also obtained between the two distinct zones A, B of the board 3 and where necessary with respect to the outside (transmit/receive).

Furthermore, according to a particular embodiment illustrated in FIG. 5, because of the presence of a central radiator 58, perpendicular to the separating partition 30, also forming a partition separating each distinct zone A, B of the board 3 into two subzones (a1, a2) and (b1, b2), it is necessary to provide, for the deflectors 42' attached partially in line with this central radiator 58, a beveled zone 52 that is offset laterally so that the opening formed by the beveled zone 52 is not partially blocked by the presence of this central radiator 58.

In summary, thanks to the invention, a separate cooling of the two distinct zones A, B of the board 3 is obtained with, for the cooling of the upstream zone B, the injection of the cooling air directly into the upstream zone B via the openings 24 in the upstream wall 22, then the passage of this partially heated air into the downstream secondary space 40 after it is transferred by the deflectors 42 situated in the upstream secondary space 38.

For the cooling of the downstream zone A, the cooling air is first injected into the upstream secondary space 38, where it is not heated since it is not in contact with the electronic components 2, this air then passing into the downstream zone A where it is partially heated before being discharged through the openings 24 provided in the downstream wall 23, after its transfer by the deflectors 42 situated in the downstream secondary space 40. The air injected into the upstream secondary space 38 has a laminar flow because of the pointed ends 50 of the deflectors 42 situated in this upstream secondary space 38 allowing an equal division into two of the current striking these points 50 and its turbulence-free passage into the beveled zone 52 of a deflector 42 situated in the downstream secondary space 40 so that it can be discharged to the downstream zone A. Similarly, the current leaving the beveled zone 52 of a deflector 42 situated in the upstream secondary space 38, which has therefore been previously directly injected into the upstream zone B, has a laminar flow, because of the symmetrical pointed ends 50 of the deflectors 42 situated in the downstream secondary space 40.

The invention claimed is:

1. Device with integrated electronic components, that comprises a board forming a support for the components, a cover mounted on the board to cover the components, and a separating partition which extends from the cover to the board substantially perpendicularly to the latter, the partition separating two distinct zones of the board in which electronic components are placed, cooling gas being able to be injected into one of the two distinct zones of the board called the "upstream zone", and able to be discharged into the other of the two distinct zones of the board, called the "downstream zone", wherein it comprises an overcover covering the cover and defining an internal space between the cover and the overcover in which are provided cooling gas division means delimiting two distinct secondary spaces in the internal space, an upstream secondary space into which cooling gas is able to be injected and a downstream secondary space into which cooling gas is able to be discharged so that cooling gas injected into the upstream zone of the board is directed toward the downstream secondary space of the internal space and that cooling gas injected into the upstream secondary space of the internal space is directed toward the downstream zone of the board.

2. Device according to claim 1, wherein the cooling gas division means comprise at least one pair of deflectors associated with at least one pair of orifices provided in the cover on either side of the separating partition, at least one deflector opening into the downstream secondary space and at least one deflector opening into the upstream secondary space.

3. Device according to claim 2, wherein the deflectors are distributed in a symmetrical manner relative to the separating partition.

4. Device according to claim 2, wherein the deflector comprises a beveled zone of increasing thickness with an edge that is substantially indistinguishable from the overcover and another edge substantially indistinguishable from the cover.

5. Device according to claim 4, wherein the edge substantially indistinguishable from the cover of the beveled zone of the deflector forms a leading edge for a deflector situated in the upstream secondary space and a trailing edge for a deflector situated in the downstream secondary space.

6. Device according to claim 4, wherein the edge substantially indistinguishable from the overcover of the beveled zone of the deflector forms a trailing edge for a deflector situated in the upstream secondary space and a leading edge for a deflector situated in the downstream secondary space.

7. Device according to claim 2, wherein each deflector comprises a substantially quadrangular central zone, and a triangular zone forming a pointed end, the height of each of the central zone and the triangular zone being equal to the distance between the cover and the overcover.

8. Device according to claim 2, wherein each deflector is made of a nonflammable material, for example of the polymer type.

9. Device according to claim 2, wherein each deflector is made of an electrically conductive material, for example of the metal type or of the filled or coated polymer type.

10. Method for cooling two distinct zones of a device with integrated electronic components that comprises a board forming a support for said components, a cover mounted on said board to cover said components, and a separating partition which extends from the cover to the board substantially perpendicularly to the latter, said partition separating the said two distinct zones of the board in which the said electronic components are placed, cooling gas being able to be injected into one of the two distinct zones of the board called the "upstream zone", and able to be discharged into the other of the two distinct zones of the board, called the "downstream zone", wherein it comprises a step of passing cooling gas via gas division means provided in an internal space between the cover and an overcover delimiting two distinct secondary spaces in the internal space, an upstream secondary space into which cooling gas is injected and a downstream secondary space into which cooling gas is discharged so that cooling gas injected into the upstream zone of the board is directed toward the downstream secondary space of the internal space and that cooling gas injected into the upstream secondary space of the internal space is directed toward the downstream zone of the board.

\* \* \* \* \*